US009435023B2

(12) United States Patent
Morimoto et al.

(10) Patent No.: US 9,435,023 B2
(45) Date of Patent: Sep. 6, 2016

(54) METHOD FOR PRODUCING CU-GA ALLOY POWDER, CU-GA ALLOY POWDER, METHOD FOR PRODUCING CU-GA ALLOY SPUTTERING TARGET, AND CU-GA ALLOY SPUTTERING TARGET

(75) Inventors: Toshio Morimoto, Yamato (JP); Tatsuya Takahashi, Yamato (JP); Isao Ando, Ichikawa (JP); Tetsufumi Komukai, Ichikawa (JP); Masanori Takagi, Ichikawa (JP); Eriko Sato, Ichikawa (JP); Hirotaka Minami, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 930 days.

(21) Appl. No.: 13/639,090

(22) PCT Filed: Apr. 7, 2011

(86) PCT No.: PCT/JP2011/058846
§ 371 (c)(1),
(2), (4) Date: Mar. 28, 2013

(87) PCT Pub. No.: WO2011/126092
PCT Pub. Date: Oct. 13, 2011

(65) Prior Publication Data
US 2013/0192986 A1 Aug. 1, 2013

(30) Foreign Application Priority Data

Apr. 9, 2010 (JP) .................. 2010-090475
Aug. 24, 2010 (JP) .................. 2010-187160
Apr. 7, 2011 (WO) .................. PCT/JP2011/058846

(51) Int. Cl.
*B22F 1/02* (2006.01)
*C23C 14/34* (2006.01)
*B22F 3/14* (2006.01)
*C22C 1/04* (2006.01)
*C22C 9/00* (2006.01)

(52) U.S. Cl.
CPC ............. *C23C 14/3414* (2013.01); *B22F 1/02* (2013.01); *B22F 3/14* (2013.01); *C22C 1/0425* (2013.01); *C22C 9/00* (2013.01); *Y02E 10/541* (2013.01); *Y02P 70/521* (2015.11)

(58) Field of Classification Search
None
See application file for complete search history.

(56) References Cited

U.S. PATENT DOCUMENTS

2005/0194036 A1* 9/2005 Basol ................ H01L 31/03923
136/252
2007/0178620 A1* 8/2007 Basol .................. H01L 31/0322
438/94

FOREIGN PATENT DOCUMENTS

JP 57107501 A 7/1982
JP 61261456 A 11/1986
JP 2008138232 A 6/2008

* cited by examiner

*Primary Examiner* — George Wyszomierski
*Assistant Examiner* — Ngoclan T Mai
(74) *Attorney, Agent, or Firm* — Haverstock & Owens LLP

(57) ABSTRACT

Provided are a method for producing a Cu—Ga alloy powder, by which a high quality Cu—Ga alloy powder to be produced readily; a Cu—Ga alloy powder; a method for producing a Cu—Ga alloy sputtering target; and a Cu—Ga alloy sputtering target. Specifically, a Cu—Ga alloy powder is produced by stirring a mixed powder containing a Cu powder and a Ga in a mass ratio of 85:15 to 55:45 at a temperature of 30 to 700° C. in an inert atmosphere thereby accomplishing alloying. Also a Cu—Ga alloy sputtering target is produced by molding the Cu—Ga alloy powder followed by sintering.

6 Claims, 8 Drawing Sheets

(A) (B) (C)

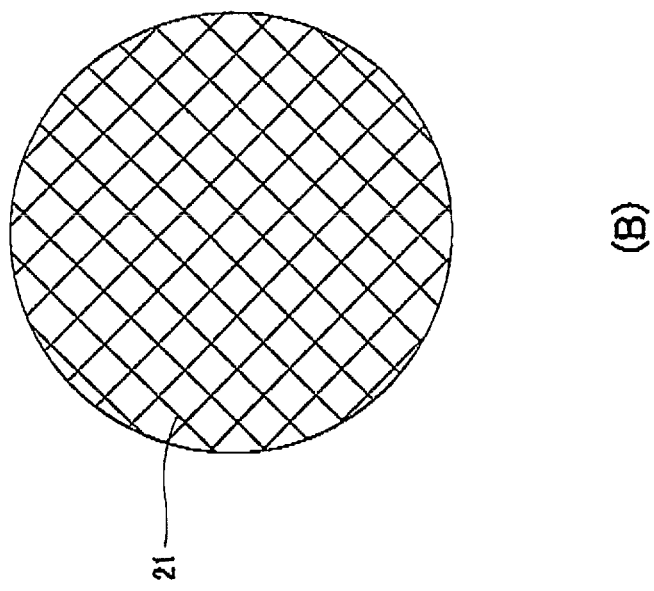
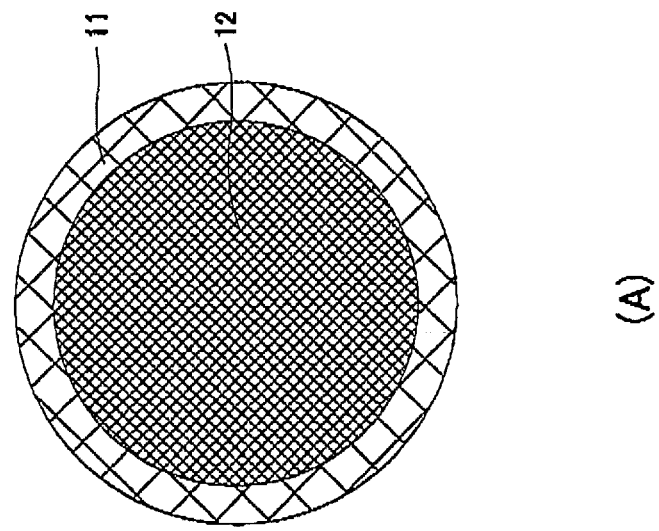
FIG.1

METHOD FOR PRODUCING CU-GA ALLOY POWDER, CU-GA ALLOY POWDER, METHOD FOR PRODUCING CU-GA ALLOY SPUTTERING TARGET, AND CU-GA ALLOY SPUTTERING TARGET

FIELD OF THE INVENTION

This invention relates to a method for producing a Cu—Ga alloy powder which is employed for forming a light-absorbing layer of a CMS (Cu—In—Ga—Se quaternary alloy) solar cell, a Cu—Ga alloy powder, a method for producing a Cu—Ga alloy sputtering target and a Cu—Ga alloy sputtering target.

The present application claims priority rights to JP Patent Application 2010-090475 filed in Japan on Apr. 9, 2010 and JP Patent Application 2010-187160 filed in Japan on Aug. 24, 2010. The total contents of disclosure of the patent application of the senior filing date are to be incorporated by reference into the present application.

BACKGROUND OF THE INVENTION

Recently, a solar power generation as one of a clean energy is increasingly focused on and a crystalline Si solar cell is employed mainly, while a CIGS (Cu—In—Ga—Se quaternary alloy)-based solar cell is also focused on especially because of its high conversion efficiency in view of supply and cost issues.

A CIGS solar cell has a basal structure consisting of a Mo electrode layer serving as a back side electrode formed on a soda lime glass substrate, a Cu—In—Ga—Se quaternary alloy film serving as a light-absorbing layer formed on this Mo electrode layer, a buffer layer comprising ZnS, CdS and the like formed on the light-absorbing layer formed on this Cu—In—Ga—Se quaternary alloy film and a transparent electrode formed on this buffer layer.

While a vapor deposition method is known as a method for forming a light-absorbing layer consisting of a Cu—In—Ga—Se quaternary alloy film, a formation by a sputtering method is proposed for the purpose of obtaining a uniform film over a larger area. The sputtering method is a method in which an In target is employed first for forming an In thin layer by sputtering, and then on this In thin layer a Cu—Ga alloy thin layer is formed by sputtering using a Cu—Ga alloy sputtering target, and the resultant laminated thin layers consisting of the In thin layer and the Cu—Ga alloy thin layer is subjected to a heat treatment in a Se atmosphere to form a Cu—In—Ga—Se quaternary alloy thin layer. A high quality Cu—Ga alloy sputtering target is desirable since the quality of this Cu—In—Ga—Se quaternary alloy film made by the sputtering method depends greatly on the quality of the Cu—Ga alloy sputtering target.

As a method for producing a Cu—Ga alloy sputtering target, a melting method and a powder sintering method are known. The melting method involves a problem that the Cu—Ga alloy of a CIGS solar cell-based composition which was conducted by melting/casting is brittle and readily broken. On the other hand, the powder sintering method is regarded as a hopeful method for producing a sputtering target which has a uniform composition.

As a powder sintering method, a method is described in Patent Document 1 in which a Cu—Ga alloy powder having a high Ga-content is mixed with a pure Cu or mixed with a Cu—Ga alloy powder having a low Ga-content to produce a sputtering target by hot press.

PRIOR-ART DOCUMENTS

Patent Document

PTL 1: Japanese Patent Application Laid-Open No. 2008-138232

SUMMARY OF THE INVENTION

A Cu—Ga alloy sintered body can not be produced directly from a Cu powder and a Ga since Ga has an extremely low melting point of 29.78° C. Accordingly, a Cu—Ga alloy powder is used for the starting material of the powder sintering method. Generally, the Cu and the Ga are melted to form an alloy, then the resultant alloy is pulverized to form a Cu—Ga alloy powder by utilizing the nature of the Cu—Ga alloy as a brittle material. Thus, in order to obtain a Cu—Ga alloy powder, a melting process where the Cu and the Ga are melted at a high temperature and a powderization process such as pulverization of a Cu—Ga alloy ingot are required.

In view of the consideration discussed above, the present invention provides a method for producing a high quality Cu—Ga alloy powder readily, a Cu—Ga alloy powder, a method for producing a Cu—Ga alloy sputtering target, and a Cu—Ga alloy sputtering target.

As a result of our intensive study, the inventors of the present invention discovered that a high quality Cu—Ga alloy powder of can readily be obtained as well as a high quality Cu—Ga alloy sputtering target by mixing a Cu powder and a Ga in a predetermined ratio followed by alloying at a temperature within a predetermined range.

Accordingly, the method for producing a Cu—Ga alloy powder comprises stirring a mixed powder containing a Cu powder and a Ga in a mass ratio of 85:15 to 55:45 at a temperature of 30 to 700° C. in an inert atmosphere thereby accomplishing alloying.

Also the Cu—Ga alloy powder according to the invention is characterized by the aforementioned production method.

The method for producing a Cu—Ga alloy sputtering target comprises a preparation step for preparing a Cu—Ga alloy powder by stirring a mixed powder containing a Cu powder and a Ga in a mass ratio of 85:15 to 55:45 at a temperature of 30 to 700° C. in an inert atmosphere thereby accomplishing alloying, and a sintering step for molding the Cu—Ga alloy powder followed by sintering.

Also the Cu—Ga alloy sputtering target according to the invention is characterized by the aforementioned production method.

Effects of the Invention

According to the present invention, a high quality Cu—Ga alloy powder can readily be obtained and a Cu—Ga alloy sputtering target having excellent uniformity and processability can also be obtained.

BRIEF DESCRIPTION OF DRAWINGS

FIG. 1 is a sectional view showing a Cu—Ga alloy powder schematically.

DETAILED DESCRIPTION OF THE INVENTION

Figure 2:
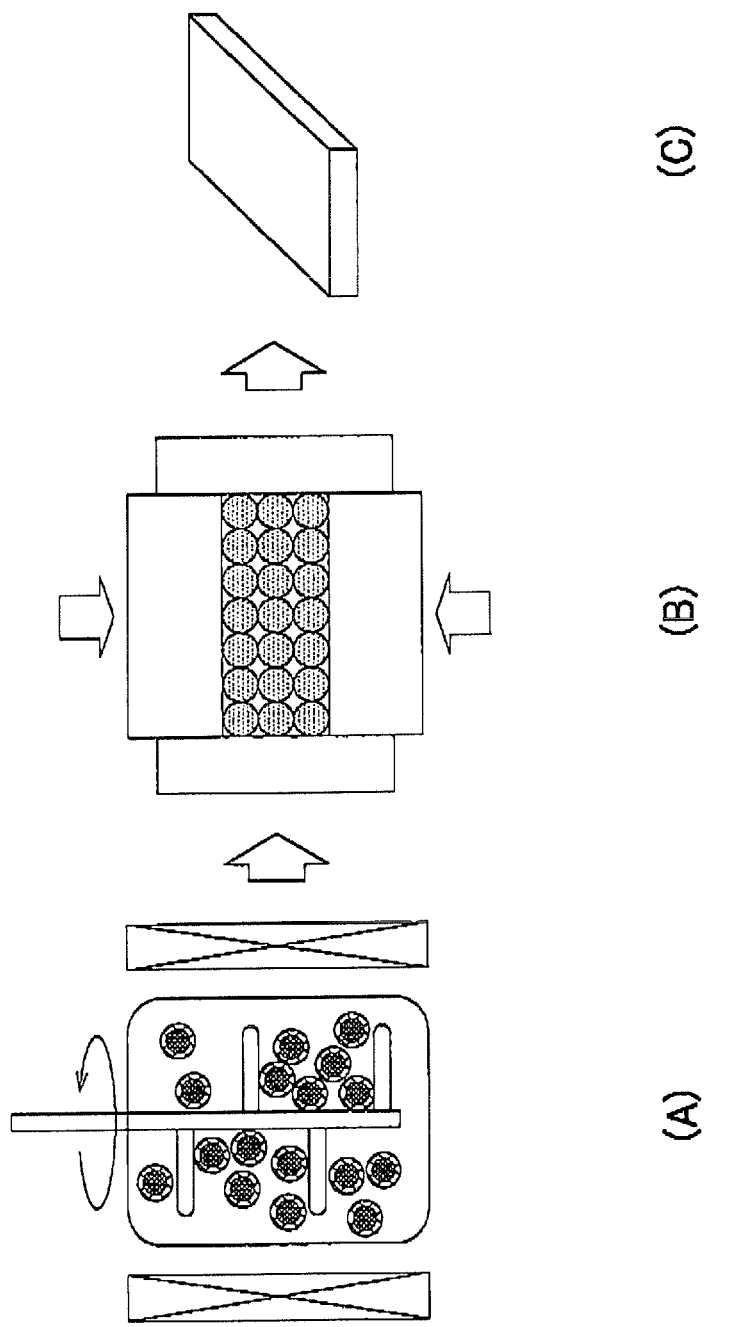
FIG. 2 is a view illustrating the outline of a method for producing a Cu—Ga alloy sputtering target in an embodiment of the invention.

The embodiments of the present invention are described in detail with reference to Figures.

<1. Cu—Ga Alloy Powder Production Method>

(Starting Materials)

The starting materials for a Cu—Ga alloy powder are a Cu powder and a Ga. The purities of the Cu powder and the Ga are selected appropriately so that the characteristics of a CIGS light-absorbing layer formed by use of a Cu—Ga alloy sputtering target are not affected adversely.

The Cu powder may, for example, be an electrolytic Cu powder produced by an electrolytic method or an atomized Cu powder produced by an atomizing method. The electrolytic Cu powder is produced by use of Cu being deposited on a cathode in the form of a sponge or a dentrite through an electrolysis in an electrolytic solution such as a copper sulfate solution. The atomized Cu powder is produced as a Cu powder in a spherical or amorphous form by means of a gas atomizing method, a water atomizing method, a centrifugal atomizing method, a melt extraction method and the like. The Cu powders produced by other methods may also be employed.

A mean particle size of the Cu powder is preferably 1 to 300 μm. The mean particle size of the Cu powder of 1 μm or more serves to prevent the scattering of the Cu powder thereby avoiding any special handling. In addition, an expensive equipment is not needed because a large-sized equipment processing an alloy powder having a large bulk volume is not needed. Also the mean particle size of the Cu powder of 300 μm or less prevents an excess Ga which is unreacted liquid phase Ga from generating because surface area (BET) of the Cu powder to be coated with the Ga is not deficient.

The mean particle size of the Cu powder is the half of the cumulated value over the all particle size (D50) which means half of particle size distribution measured by a laser diffraction method.

Ga is a metal whose melting point is low (m.p.=29.78° C.) and is melted readily by heating. The melted Ga coats the Cu powder to be formed a binary alloy. While the shape of the Ga is not limited, a fine piece is preferable for an easy weighing. Such a fine piece can be obtained by melting/casting the Ga at about room temperature followed by pulverizing.

(Mixing)

The Cu powder and the Ga are mixed in a mass ratio of 85:15 to 55:45. Ga is a metal whose melting point is low (m.p.=29.78° C.) and is melted readily by heating, and the melted Ga coats the Cu powder. An amount of the Ga of 15% by mass or more enables the formation of a uniform coating and the formation of a uniform alloy matrix in the case of sintering. An amount of the Ga of 45% by mass or less prevents the aggregation which is caused by a large amount of the Ga existing between the Cu powders, thereby increasing yield of the alloy powder.

A further preferable range of the Ga amount is 25 to 41% by mass. An amount of the Ga of 25% by mass or more enables the uniform coating within a short period, while an amount of the Ga of 41% by mass or less enables the Ga coating the Ga powder to be alloyed within a short period.

(Alloying)

The mixed powder containing the Cu powder and the Ga in the mass ratio described above is stirred at a temperature of 30 to 700° C. in an inert atmosphere thereby producing a Cu—Ga alloy powder. Typically, the Cu powder and the Ga pieces weighed in the mass ratio described above are subjected to a temperature controlled within the range higher than the melting point of Ga to lower than the melting point of Cu, i.e., within the range of 30 to 700° C., thereby forming a Cu—Ga binary alloy on the surface or inside of the Cu powder.

For example, the mixed powder is stirred at a temperature of 30° C. or higher and below 400° C. in an inert atmosphere to form a Cu—Ga binary alloy layer on the surface of the Cu powder, thereby obtaining a Cu—Ga alloy powder having excellent strength and moldability. Alternatively, the mixed powder is stirred a at a temperature of 400° C. or higher and 700° C. or lower in an inert atmosphere to form a Cu—Ga binary alloy inside of the Cu powder, thereby obtaining a Cu—Ga alloy powder having a uniform composition. A following procedure is acceptable that the mixed powder is stirred at a temperature of 30° C. or higher and below 400° C. in an inert atmosphere thereby accomplishing alloying and then this resultant alloyed powder is subjected to a heat treatment at a temperature of 400° C. or higher and 700° C. or lower in an inert atmosphere.

As described above, by heating the mixed powder at a temperature of 30° C. or higher, the Ga is melted thereby having the alloying reaction proceeded. In addition, by heating the mixed powder at a temperature of 700° C. or lower, an expensive equipment used under the condition of a high temperature is not required, and the electrical powder required for heating this equipment can be reduced.

The Cu—Ga alloy powder is considered to be formed with the following processes. Thus, the Ga which is liquefied more than the melting point is turned into fine droplets by the shear movement of the mixing and these fine droplets are dispersed uniformly in the interstices of the Cu powders. The dispersed Ga droplets adhere to the surfaces of the Cu powders, and contacts between the Cu powders and the Ga droplets causes the diffusion of the Ga into the Cu powders resulting in an increased Ga concentration in the Cu powders. And the alloying reaction proceeds while Cu—Ga intermetallic compounds are formed. Upon this, the surface of the powder is a Cu—Ga intermetallic compound layer having a high Ga concentration, while the core is ether a pure Cu or a Cu phase which is a solid solution where the Ga is dissolved into the Cu.

This mixing of the Cu powder and the Ga is effective for the advancement of the uniform alloying reaction. The shear movement of the mixing is also considered to suppress the aggregation due to the adhesion of the powders. Once the aggregation is formed, a void is formed in the sintered body by the aggregate, during the sintering step such as a hot press, resulting in an uneven density.

The heating and the mixing can be accomplished by using a mixing device involving an agitating impeller or an agitating blade inside of a container. It is also acceptable to use a rotary container-type mixing device such as cylinder, double-cone and twine shell devices. Balls may be added into the container to enhance the mixing.

The material for the container is selected on the basis of the heat resistance and the prevention of adhesion of a Ga and a Cu—Ga alloy to the container. Those which can be employed include glass containers such as those made from borosilicate glass, quartz glass and the like, ceramic containers such as those made from alumina and zirconia, Teflon (trade mark) resin containers, Teflon (trade mark)-coated containers, enamel-covered containers and the like.

The heating and the mixing are conducted preferably in an inert atmosphere such as argon gas or nitrogen gas. The heating and the mixing in an inert atmosphere can suppress the increase in the oxygen content of the alloy powder.

(Cu—Ga Alloy Powder)

FIG. 1 is a schematic sectional view showing the Cu—Ga alloy powder obtained by the method described above. This Cu—Ga alloy powder contains 15 to 45% by mass of a Ga and the remainder consists of a Cu and unavoidable impurities.

FIG. 1 (A) illustrates the Cu—Ga alloy powder obtained by alloying the mixed powder containing a Cu powder and a Ga at a temperature of 30° C. or higher and below 400° C. in an inert atmosphere. This Cu—Ga alloy powder has a superficial Cu—Ga binary alloy layer 11 and a core of Cu 12. In this structure of the Cu—Ga alloy powder, the core of Cu 12 provides increased strength and excellent moldability. Also sintering this Cu—Ga alloy powder provides the Cu—Ga alloy sputtering target having a uniform composition.

FIG. 1 (B) illustrates the Cu—Ga alloy powder obtained by stirring the mixed powder containing a Cu powder and a Ga at a temperature of 400° C. or higher and 700° C. or lower in an inert atmosphere thereby accomplishing alloying. Alternatively, FIG. 1(B) illustrates the Cu—Ga alloy powder obtained by stirring the mixed powder at a temperature of 30° C. or higher and below 400° C. in an inert atmosphere thereby accomplishing alloying and then subjecting this alloyed powder to a heat treatment at a temperature of 400° C. or higher and 700° C. or lower in an inert atmosphere. This Cu—Ga alloy powder consists of a Cu—Ga binary alloy 21 having a uniform composition. Accordingly sintering this Cu—Ga alloy powder provides the Cu—Ga alloy sputtering target having a uniform composition.

<2. Method for Producing the Cu—Ga Alloy Sputtering Target>

The method for producing the Cu—Ga alloy sputtering target using the aforementioned Cu—Ga alloy powder is described.

FIG. 2 illustrates an outline of the method for producing the Cu—Ga alloy sputtering target in an embodiment of the invention. A preparation step (A) for preparing the Cu—Ga alloy powder, a sintering step (B) for sintering the Cu—Ga alloy powder and a finishing step(C) are provided.

In the preparation step (A), Cu—Ga alloy powder producing method similar to the aforementioned, the mixed powder containing the Cu powder and the Ga in a mass ratio of 85:15 to 55:45 at a temperature of 30 to 700° C. in an inert atmosphere is stirred thereby accomplishing alloying whereby obtaining a Cu—Ga alloy powder. This Cu—Ga alloy powder can be obtained for example by using a mixing device having an agitating impeller and an external heater as shown in FIG. 2 (A).

In the following sintering step (B), the Cu—Ga alloy powder is molded for example by using a press and the molded article thus obtained is subjected to a powder sintering method involving a sintering procedure at 400 to 800° C. A Cu—Ga alloy sintered body having a uniform composition can be obtained since a Cu and a Ga diffuse during sintering at 400 to 800° C. Sintering in an inert atmosphere is acceptable. A hot press method involving a pressurization of the starting powder placed in a heat-resistant mold at a high temperature (HP method), a hot isostatic pressing sintering method involving a pressurization of materials to be treated at a high temperature under a high pressure in an isostatic manner (HIP method), and the like are acceptable. The hot press in methods mentioned above can produce a high density sintered body at low cost.

In the finishing step (C), a surface of the Cu—Ga alloy sintered body is grinded to obtain the flat surface, and bonded onto a Cu backing plate to obtain a Cu—Ga alloy sputtering target.

The present invention that the Cu powder and the Ga are mixed in a predetermined ratio followed by alloying at a temperature within a predetermined range can be substituted for a prior art that a Cu—Ga alloy ingot is obtained by melting/casting method followed by pulverization. Accordingly the high quality Cu—Ga alloy powder can be obtained readily and the Cu—Ga alloy sputtering target having a uniform composition can be obtained readily at low cost.

EXAMPLES

The followings are Examples of the present invention. The present invention is not limited thereby.

Example 1

A 300-mL ceramic beaker mounted on a mantle heater and a stirring device having a glass impeller attached to this ceramic-beaker were placed under argon gas atmosphere in a glove box.

68.0 g of an atomized Cu powder a mean particle size: 106 μm, oxygen: 0.04% by mass and 32.0 g of Ga pieces were weighed and placed in the beaker, and then heating and mixing were conducted in the argon atmosphere for 45 minutes at 300° C. with stirring. As a result, a color of resultant powder was a grayish white which was different from one of the Cu powder.

Figure 3:
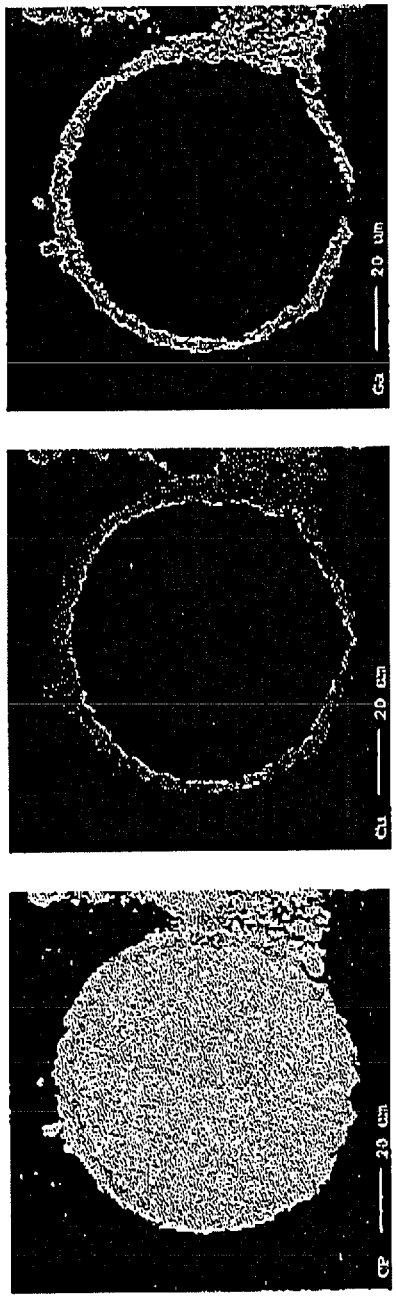
FIG. 3 is a photograph of the section of a Cu—Ga alloy powder by a mapping of EPMA analysis.
Figure 4:
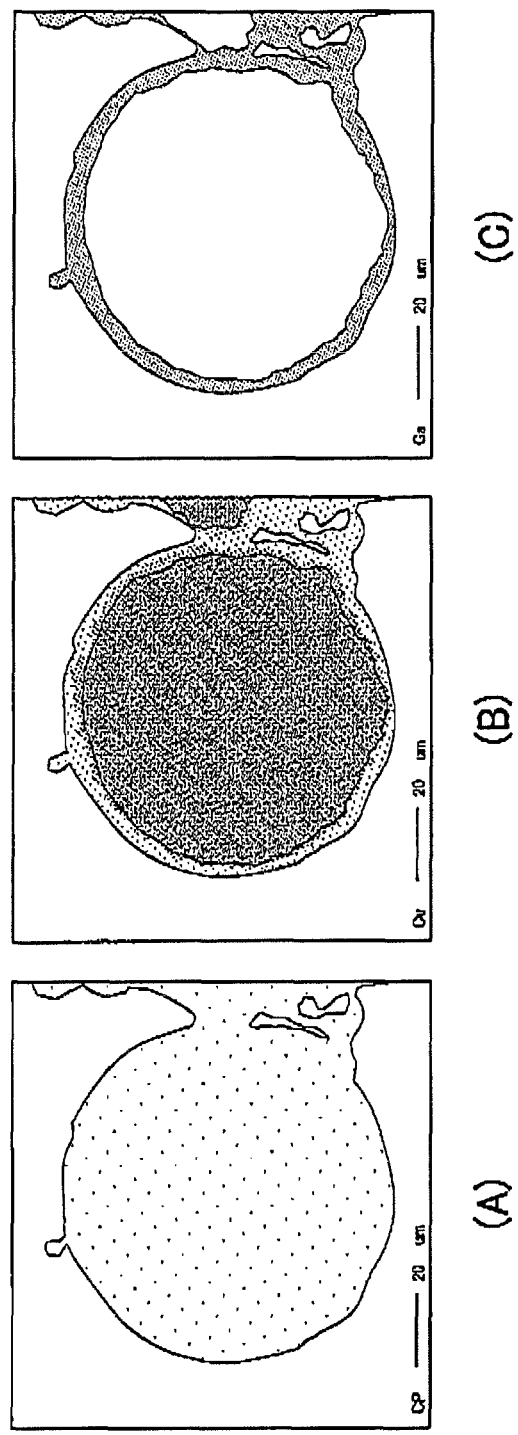
FIG. 4 is a schematic view of the photograph of the section in FIG. 3

The section of the resultant powder was observed with an electronic probe microanalyzer (EPMA) (JXA-8100: manufactured by JEOL Ltd.) at an acceleration voltage of 15 kV. And then a mapping of EPMA analysis was conducted. In FIG. 3, photographs are the section of the Cu—Ga alloy powder by the mapping of EPMA analysis. (A) is a secondary electron image of the Cu—Ga alloy powder, (B) is a Cu mapping image and (C) is a Ga mapping image. A level of concentration in FIG. 3 is represented by a color from blue to red. The high level is represented by red while the low level is represented by blue. Schematic views in FIG. 4 correspond to the photographs in FIG. 3, (A) to (C) in FIG. 4 correspond to (A) to (C) in FIG. 3, respectively. A level of concentration in FIG. 4 is represented by number of dots per unit area. The high level is represented by a large number of dots per unit area while the low level is represented by a small number of dots per unit area. The Cu mapping image showed the inside of the powder as a red color and the surface of the powder as a light blue color, while the Ga mapping image showed the inside of the powder as a black color and the surface of the powder as an orange color. Accordingly it was found that the Cu—Ga alloy powder had the Cu—Ga binary alloy layer formed on the surface of the Cu powder.

Subsequently, a press machine, and a press die which has a section size of a length of 100 mm and a width of 100 mm were employed to conduct a press molding of the Cu—Ga alloy powder under a pressure of 196 MPa. This molded article was sintered for 1 hour under conditions involving a vacuum degree of $2 \times 10^{-2}$ Pa and a temperature of 700° C. using a vacuum sintering furnace (manufactured by Shimadzu Mectem, Inc.) to produce a Cu—Ga alloy sintered body having a length of 100 mm, a width of 100 mm and a thickness of 5 mm.

The mapping of EPMA analysis was conducted for the sectional area obtained by cutting a part of the sintered body to evaluate the compositional uniformity of the resultant Cu—Ga alloy sintered body.

Figure 5:
FIG. 5 is a photograph of the section of a Cu—Ga alloy sintered body by a mapping of EPMA analysis.
Figure 6:
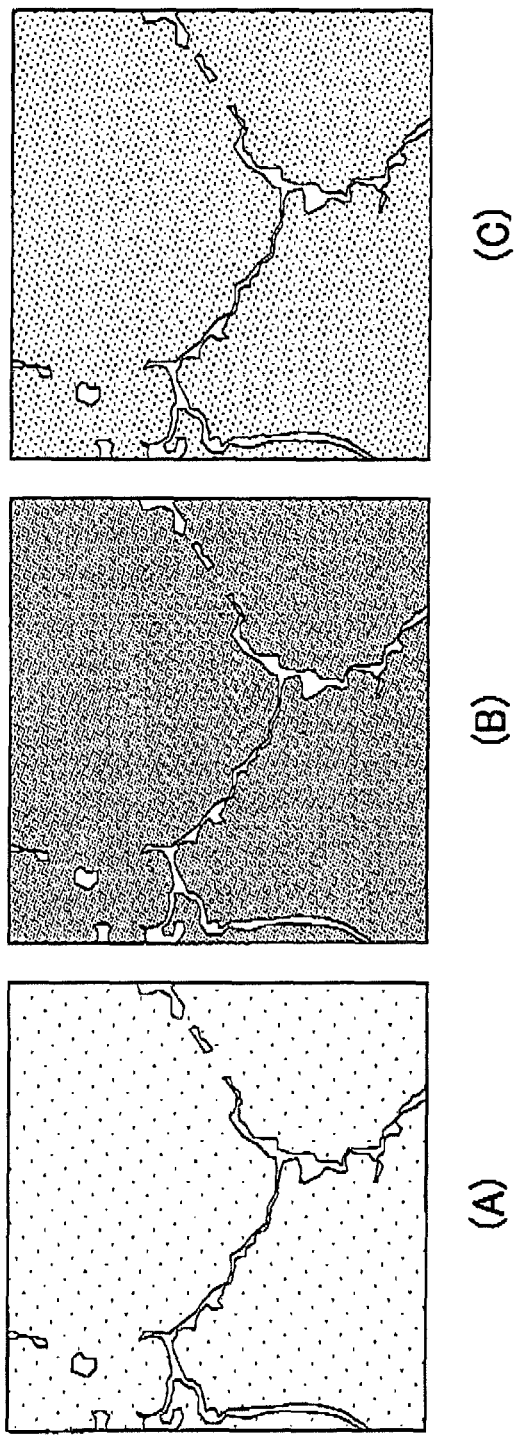
FIG. 6 is a schematic view of the photograph of the section in FIG. 5.

FIG. 5 is a photograph of the section of a Cu—Ga alloy sintered body by the mapping of EPMA analysis. In this FIG. 5, photographs are the section of the Cu—Ga alloy powder by the mapping of EPMA analysis. (A) is a secondary electron image of the Cu—Ga alloy powder, (B) is a Cu mapping image and (C) is a Ga mapping image. A level of concentration in FIG. 3 is represented by a color from blue to red. The high level is represented by red while the low level is represented by blue. Schematic views in FIG. 6 correspond to the photographs in FIG. 5, (A) to (C) in FIG. 6 correspond to (A) to (C) in FIG. 5, respectively. A level of concentration in FIG. 6 is represented by number of dots per unit area. The high level is represented by a large number of dots per unit area while the low level is represented by a small number of dots per unit area. Based on the results shown in this FIG. 5, it was found that the Cu and the Ga in the Cu—Ga alloy sintered body was alloyed uniformly.

The surface of the Cu—Ga alloy sintered body was grinded. Then the Cu—Ga alloy sintered body was machined to be formed a size of 100 mm in length, 100 mm in width and 4 mm in thickness, and then bonded onto a Cu backing plate for a Cu—Ga alloy sputtering target.

Example 2

The same processing as Example 1 was performed, except for using an atomized Cu powder (a mean particle size: 37 μm, oxygen: 0.03% by mass) as a starting material of the Cu powder, employing a heating temperature of 400° C., and a heating time period of 2 hours. The resultant Cu—Ga alloy powder was a grayish white powder.

Figure 7:
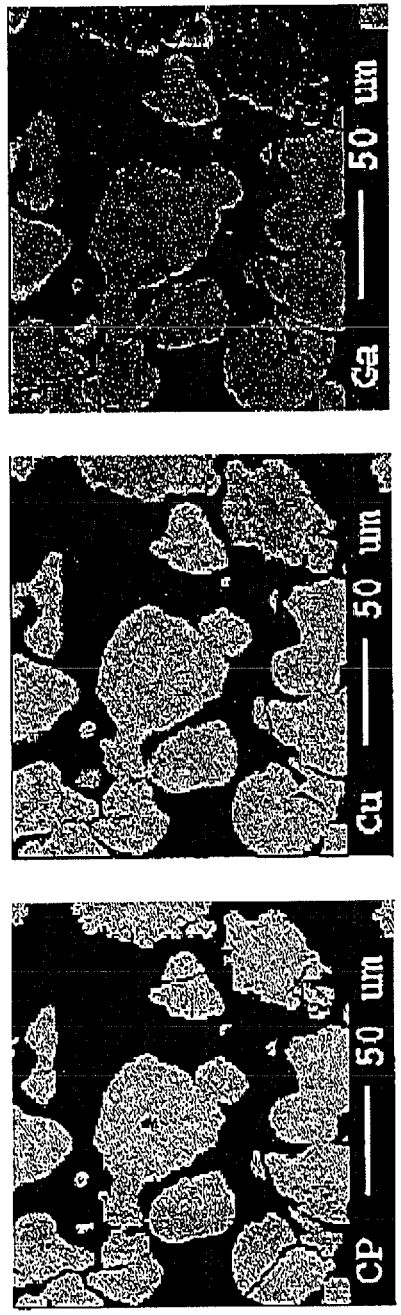
FIG. 7 is a photograph of the section of a Cu—Ga alloy powder by a mapping of EPMA analysis.

The section of the resultant powder was observed with an electronic probe microanalyzer (EPMA) (JXA-8100: manufactured by JEOL Ltd.) at an acceleration voltage of 15 kV. And then a mapping of EPMA analysis was conducted. In this FIG. 7, photographs are the section of the Cu—Ga alloy powder by the mapping of EPMA analysis. (A) is a secondary electron image of the Cu—Ga alloy powder, (B) is a Cu mapping image and (C) is a Ga mapping image. A level of concentration in FIG. 7 is represented by a color from blue to red, similarly to FIG. 3.

Figure 8:
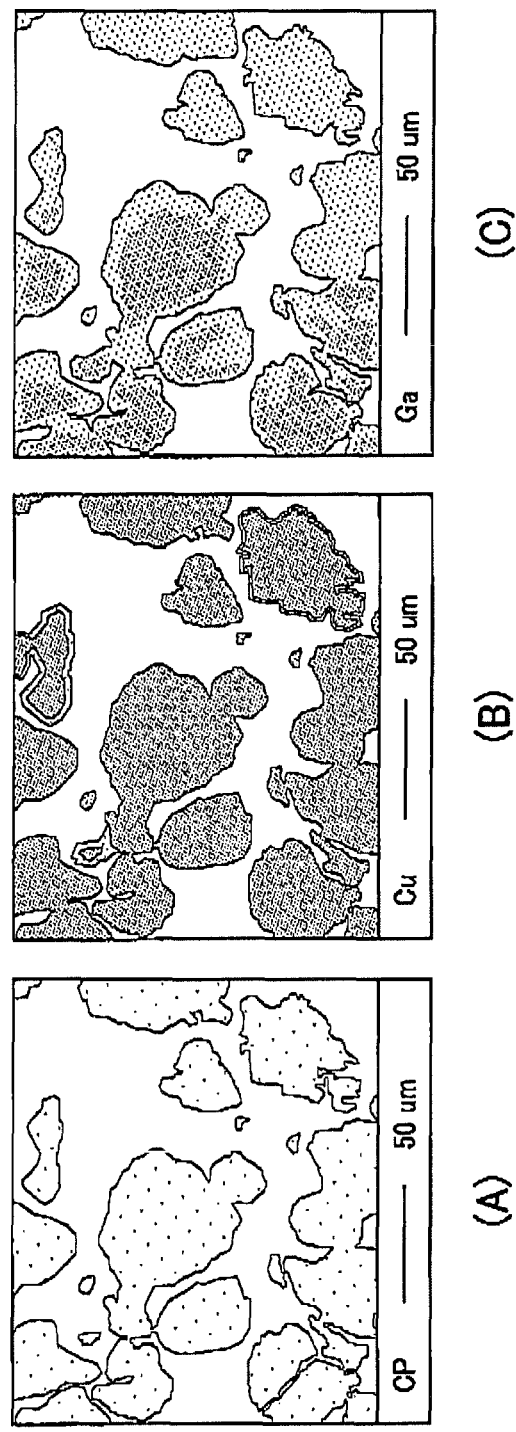
FIG. 8 is a schematic view of the photograph of the section in FIG. 7.

The high level is represented by red while the low level is represented by blue. Schematic views in FIG. 8 correspond to the photographs in FIG. 7, (A) to (C) in FIG. 8 correspond to (A) to (C) in FIG. 7, respectively. A level of concentration in FIG. 8 is represented by number of dots per unit area. The high level is represented by a large number of dots per unit area while the low level is represented by a small number of dots per unit area. Based on the results shown in FIG. 7, it was found that the Cu—Ga alloy powder had a uniform composition that the Cu—Ga binary alloy was formed also inside of the Cu powder.

The same processing as Example 1 was performed, also using this Cu—Ga alloy powder.

Examples 3 to 11, Comparatives 1 to 3

In Examples 3 to 9 and Comparatives 1 to 3, the same processing as Example 1 was performed, except for employing the mixing ratios of the Cu powder and the Ga as starting material as shown in Table 1. The same processing as Example 1 was performed, except for employing an electrolytic powder (mean particle size: 37 μm) as a Cu powder. The same processing as Example 1 was performed, except for employing an atomized Cu powder having a mean particle size of 45 μm. Also the same processing as Example 1 was performed, except for employing a sintering temperature of 500° C. in Example 8 and a sintering temperature of 400° C. in Example 9 and Comparative 3.

Table 1 shows the evaluation results of Examples 1 to 11 and Comparatives 1 to 3. The yield was expressed based on a ratio of the resultant powder weight to the total weight of the starting materials. The results were judged as excellent when the ratio was 97% or higher, good when 90 to 97%, and poor when 90% or lower. The compositional uniformity of the sintered body was evaluated by following procedure. Ten places were selected randomly in a section at a core of a thickness direction of the sintered body. Each place has an area of 10 mm square. The mapping of EPMA analysis was conducted for each place to evaluate variation of the Ga concentration. Variation within ±5% is considered as good while variation over ±5% as poor. The processability of the sintered body was judged by counting the number of crack or chip in 10 cm of sintered body's side after surface grinding. The number less than 1 is considered as excellent, the number not less than 1 less than 3 as good, and the number not less than 3 as poor.

TABLE 1

| | Starting material of Cu powder | | | Mean particle size (μm) | Alloying temperature (° C.) | Heating time | Sintering method | Yield during stirring | Uniformity of Sintered body | Processability |
|---|---|---|---|---|---|---|---|---|---|---|
| | Composition (% by mass) | | | | | | | | | |
| | Cu | Ga | Type | | | | | | | |
| Example 1 | 68 | 32 | Atomized powder | 106 | 300 | 45 Minutes | Vacuum sintering | Excellent | Good | Excellent |
| Example 2 | 68 | 32 | Atomized powder | 37 | 400 | 2 Hours | Vacuum sintering | Excellent | Good | Excellent |
| Example 3 | 85 | 15 | Atomized powder | 106 | 300 | 45 Minutes | Vacuum sintering | Excellent | Good | Excellent |

TABLE 1-continued

| | Composition (% by mass) | | Starting material of Cu powder | Mean particle size (μm) | Alloying temperature (° C.) | Heating time | Sintering method | Yield during stirring | Uniformity of Sintered body | Processability |
|---|---|---|---|---|---|---|---|---|---|---|
| | Cu | Ga | Type | | | | | | | |
| Example 4 | 80 | 20 | Atomized powder | 106 | 300 | 45 Minutes | Vacuum sintering | Excellent | Good | Excellent |
| Example 5 | 75 | 25 | Atomized powder | 106 | 300 | 45 Minutes | Vacuum sintering | Excellent | Good | Excellent |
| Example 6 | 70 | 30 | Atomized powder | 106 | 300 | 45 Minutes | Vacuum sintering | Excellent | Good | Excellent |
| Example 7 | 65 | 35 | Atomized powder | 106 | 300 | 45 Minutes | Vacuum sintering | Excellent | Good | Excellent |
| Example 8 | 60 | 40 | Atomized powder | 106 | 300 | 45 Minutes | Vacuum sintering | Good | Good | Good |
| Example 9 | 55 | 45 | Atomized powder | 106 | 300 | 45 Minutes | Vacuum sintering | Good | Good | Good |
| Example 10 | 68 | 32 | Electrolytic powder | 37 | 300 | 45 Minutes | Vacuum sintering | Excellent | Good | Excellent |
| Example 11 | 68 | 32 | Atomized powder | 45 | 300 | 45 Minutes | Vacuum sintering | Excellent | Good | Excellent |
| Comparative 1 | 95 | 5 | Atomized powder | 106 | 300 | 45 Minutes | Vacuum sintering | Excellent | Poor | Excellent |
| Comparative 2 | 90 | 10 | Atomized powder | 106 | 300 | 45 Minutes | Vacuum sintering | Excellent | Poor | Excellent |
| Comparative 3 | 50 | 50 | Atomized powder | 106 | 300 | 45 Minutes | Vacuum sintering | Poor | Good | Poor |

In Example 12 to Example 17, the Cu—Ga alloy sputtering targets were produced under the condition where the alloying temperature and the heat treatment temperature varied.

Example 12

68.0 g of an atomized Cu powder (a mean particle size: 5 μm, oxygen: 0.12% by mass), 32.0 g of Ga pieces and 40 zirconia balls each having a diameter of 10 mm were loaded into a 300-mL Teflon (trade mark) ball mill in the shape of cylinder which was placed under an argon gas atmosphere in a glove box. Then the ball mill was closed tightly with the Teflon (trade mark) container closure and the argon gas was introduced. The ball mill rack was placed in an oven heated at 70° C. and the ball mill was mounted to conduct both heating and mixing in an argon gas atmosphere for 1 hour at a rotation speed of 30 rpm. Then the ball mill was cooled to a room temperature, and then the container closure was opened to recover the content. A grayish white powder was obtained.

This powder was subjected to a heat treatment for 1 hour at 480° C. in an argon gas atmosphere. The results of the EPMA observation of the section of the heat-treated powder showed that a Cu—Ga alloy powder was composed of a core and an outer core. The core is ether a Cu or a Cu—Ga alloy phase which is a solid solution where a Ga is dissolved into the Cu. The outer core was a Cu—Ga alloy phase having a Ga concentration of 30 to 70% by mass. The Ga concentration of the Cu—Ga alloy powder analyzed was 32.1% by mass and the oxygen content of that was 0.10% by mass. Thus, the composition of the Cu—Ga alloy powder was the same as one of the starting materials for preparing the Cu—Ga alloy powder. Also based on the comparison of the oxygen content between the starting Cu powder and the resultant Cu—Ga alloy powder, it was confirmed that the oxidation during the preparation of the Cu—Ga alloy powder was prevented.

This Cu—Ga alloy powder was loaded in a graphite mold having an inner diameter of 60 mm and subjected to a hot press (manufactured by Diavac Limited). The hot pressing was conducted for 1 hour at 700° C. under a pressure of 250 MPa at a vacuum degree of $5 \times 10^{-3}$ Pa to produce a sintered body of 60 mm in diameter and 3 mm in thickness. The density based on the size and the weight of the target body was 8.32 g/cm$^3$. A part of the target body was sampled by cutting and the section was subjected to an SEM observation, which showed a dense material with no voids. The EPMA observation showed no segregation of the Ga concentration and a variation of Ga concentration within ±5%. Accordingly the Cu—Ga alloy matrix is considered to be uniform.

This target body was also bonded to a Cu backing plate to produce a Cu—Ga alloy target. Then this target was mounted on a sputtering equipment (SH-450, manufactured by Ulvac, Inc.) where a direct current DC100W was supplied to the target under an argon gas pressure of 0.7 Pa, and it was proven that a satisfactory sputtering could be accomplished without any abnormal electrical discharge or splash.

Example 13

300-mL Pyrex (trade mark) beaker mounted on a mantle heater and a stirring device having a glass impeller were placed under an argon gas atmosphere in a glove box. 68 g of an electrolytic Cu powder (mean particle size: 97 μm, oxygen: 0.04% by mass) and 32 g of Ga pieces were placed in a beaker, and then heating and mixing were conducted in an argon atmosphere for 1 hour at 250° C. with stirring. As a result, a grayish white powder was obtained.

This Cu—Ga alloy powder was subjected to a heat treatment for 1 hour at 480° C. in an argon gas atmosphere similarly to Example 12. The results of the EPMA observation of the section of the heat-treated powder showed the Cu—Ga alloy powder similar to Example 12. The Ga concentration of the Cu—Ga alloy powder analyzed was 31.9% by mass and the oxygen content of that was 0.04% by mass. Thus, the composition of the Cu—Ga alloy powder was the same as one of the starting materials similarly to Example 12 and it was also confirmed that the oxidation during the preparation of the Cu—Ga alloy powder was prevented.

Also this Cu—Ga alloy powder was employed to produce a target body, similarly to Example 12. The density based on the size and the weight of the target body was 8.41 g/cm$^3$. The SEM observation of the target body's section conducted similarly to Example 12 showed a dense material with no voids. The EPMA observation showed no segregation of the Ga concentration and the variation of the Ga concentration within ±5%. Accordingly the Cu—Ga alloy matrix is considered to be uniform.

Also a Cu—Ga alloy target was produced similarly to Example 12 and it was proven that a satisfactory sputtering could be accomplished without any abnormal electrical discharge or splash.

Example 14

300-mL ceramic beaker mounted on a mantle heater and a stirring device having a glass impeller were placed under an argon gas atmosphere in a glove box. 68.0 g of an atomized Cu powder (a mean particle size: 38 μm, oxygen: 0.03% by mass) and 32.0 g of Ga pieces were placed in a beaker, and then heating and mixing were conducted in an argon atmosphere for 1 hour at 550° C. As a result, a grayish white powder was obtained. This powder was not subjected to the heat treatment.

The results of the EPMA observation of the section of this powder showed the Cu—Ga alloy powder similar to Example 12. The Ga concentration of the Cu—Ga alloy powder analyzed was 32.1% by mass and the oxygen content of that was 0.03% by mass. The composition of the Cu—Ga alloy powder was the same as one of the starting materials similarly to Example 12 and it was also confirmed that the oxidation during the preparation of the Cu—Ga alloy powder was prevented.

Also this Cu—Ga alloy powder was employed to produce a target body, similarly to Example 12. The density based on the size and the weight of the target body was 8.36 g/cm$^3$. The SEM observation of the target body's section conducted similarly to Example 12 showed a dense material with no voids. The EPMA observation showed no segregation of the Ga concentration and the variation of the Ga concentration within ±5%. Accordingly the Cu—Ga alloy matrix is considered to be uniform.

Also a Cu—Ga alloy target was produced similarly to Example 12 and it was proven that a satisfactory sputtering could be accomplished without any abnormal electrical discharge or splash.

Example 15

The same processing as Example 14 was performed, except for using 80.0 g of the atomized Cu powder (a mean particle size: 38 μm, oxygen: 0.03% by mass) and 20.0 g of Ga pieces. As a result, a grayish white powder was obtained. This powder was not subjected to the heat treatment.

The results of the EPMA observation of the section of this powder showed the Cu—Ga alloy powder similar to Example 12. The Ga concentration of the Cu—Ga alloy powder analyzed was 19.9% by mass and the oxygen content of that was 0.03% by mass. The composition of the Cu—Ga alloy powder was the same as one of the starting materials similarly to Example 12 and it was also confirmed that the oxidation during the preparation of the Cu—Ga alloy powder was prevented.

Also this Cu—Ga alloy powder was employed to produce a target body, similarly to Example 12. The density based on the size and the weight of the target body was 8.31 g/cm$^3$. The SEM observation of the target body's section conducted similarly to Example 12 showed a dense material with no voids. The EPMA observation showed no segregation of the Ga concentration and the variation of the Ga within ±5%. Accordingly the Cu—Ga alloy matrix is considered to be uniform.

Also, a Cu—Ga alloy target was produced similarly to Example 12 and it was proven that a satisfactory sputtering could be accomplished without any abnormal electrical discharge or splash.

Example 16

The same processing as Example 14 was performed, except for using 60.0 g of the atomized Cu powder (a mean particle size: 38 μm, oxygen: 0.03% by mass) and 40.0 g of Ga pieces. As a result, a grayish white powder was obtained. This powder was not subjected to the heat treatment.

The results of the EPMA observation of the section of this powder showed the Cu—Ga alloy powder similar to Example 12. The Ga concentration of the Cu—Ga alloy powder analyzed was 40.0% by mass and the oxygen content of that was 0.03% by mass. The composition of the Cu—Ga alloy powder was the same as one of the starting materials similarly to Example 12 and it was also confirmed that the oxidation during the preparation of the Cu—Ga alloy powder was prevented.

Also this Cu—Ga alloy powder was employed to produce a target body, similarly to Example 12, except for using a hot press temperature of 400° C. The density based on the size and the weight of the target body was 8.43 g/cm$^3$. The SEM observation of the target body's section conducted similarly to Example 12 showed a dense material with no voids. The EPMA observation showed no segregation of the Ga concentration and the variation of the Ga within ±5%. Accordingly the Cu—Ga alloy matrix is considered to be uniform.

Also a Cu—Ga alloy target was produced similarly to Example 12 and it was proven that a satisfactory sputtering could be accomplished without any abnormal electrical discharge or splash.

Example 17

The same processing as Example 14 was performed, except for using an atomized Cu powder having a mean particle size of 178 μm (oxygen: 0.01% by mass or less). As a result, a grayish white powder was obtained. This powder was not subjected to the heat treatment.

The results of the EPMA observation of the section of this powder showed the Cu—Ga alloy powder similar to Example 12. The Ga concentration of the Cu—Ga alloy powder analyzed was 32.0% by mass and the oxygen content of that was 0.01% by mass or less. The composition of the Cu—Ga alloy powder was the same as one of the starting materials similarly to Example 12 and it was also confirmed that the oxidation during the preparation of the Cu—Ga alloy powder was prevented.

Also this Cu—Ga alloy powder was employed to produce a target body, similarly to Example 12. The density based on the size and the weight of the target body was 8.29 g/cm$^3$. The SEM observation of the target body's section conducted similarly to Example 12 showed a dense material with no voids. The EPMA observation showed no segregation of the Ga concentration and the variation of the Ga within ±5%. Accordingly the Cu—Ga alloy matrix is considered to be uniform.

Also a Cu—Ga alloy target was produced similarly to Example 12 and it was proven that a satisfactory sputtering could be accomplished without any abnormal electrical discharge or splash.

Example 18

A 300-mL ceramic beaker mounted on a mantle heater and a stirring device having a glass impeller were placed under an argon gas atmosphere in a glove box. 68.0 g of an electrolytic Cu powder (a mean particle size: 300 μm, oxygen: 0.04% by mass) and 32.0 g of Ga pieces were placed in a beaker, and then heating and mixing were conducted in an argon atmosphere for 2 hours at 700° C. with stirring. As a result, a grayish white powder was obtained. This powder was not subjected to the heat treatment. The results of the EPMA section observation of this powder showed the Cu—Ga alloy powder similar to Example 12. The Ga concentration of the Cu—Ga alloy powder analyzed was 32.0% by mass and the oxygen content of that was 0.05% by mass or less.

Also this Cu—Ga alloy powder was placed in a graphite mold having an inner diameter of 60 mm and subjected to a hot press where hot pressing was conducted for 2 hours at 700° C. under a pressure of 250 MPa at a vacuum degree of $5 \times 10^{-3}$ Pa to produce a sintered body of 60 mm in diameter and 3 mm in thickness, similarly to Example 12.

The density based on the size and the weight of the target body was 8.30/cm³. A part of the target body was subjected to the section observation, which showed a dense and uniform matrix. The SEM observation of the target body's section conducted similarly to Example 12 showed a dense material with no voids. The EPMA observation showed no segregation of the Ga concentration and the variation of the Ga within ±5%. Accordingly the Cu—Ga alloy matrix is considered to be uniform.

Also a Cu—Ga alloy target was produced similarly to Example 12 and it was proven that a satisfactory sputtering could be accomplished without any abnormal electrical discharge or splash.

Example 19

68.0 g of an electrolytic Cu powder (a mean particle size: 97 μm, oxygen: 0.013% by mass), 32.0 g of Ga pieces and 40 zirconia balls each having a diameter of 10 mm were loaded into a 300-mL, Teflon (trade mark) ball mill in the shape of cylinder which was placed under an argon gas atmosphere in a glove box. Then the ball mill was closed tightly with the Teflon (trade mark) container closure and the argon gas was introduced. The ball mill rack was placed in an oven heated at 30° C. and the ball mill was mounted to conduct both heating and mixing in an argon gas atmosphere for 1 hour at a rotation speed of 30 rpm. Then the ball mill was cooled to room temperature, and then the container closure was opened to recover the content. A grayish white powder was obtained.

This powder was subjected to a heat treatment for 1 hour at 480° C. in an argon gas atmosphere. The results of the EPMA observation of the section of the heat-treated powder showed that a Cu—Ga alloy powder was composed of a core and an outer core. The core is ether a Cu or a Cu—Ga alloy phase which is a solid solution where a Ga is dissolved into the Cu. The outer core was a Cu—Ga alloy phase having a Ga concentration of 30 to 70% by mass. The results of the EPMA observation of the section of the heat-treated powder showed the Cu—Ga alloy powder similar to Example 12. The Ga concentration of the Cu—Ga alloy powder analyzed was 32.1% by mass and the oxygen content of that was 0.02% by mass. Thus, the composition of the Cu—Ga alloy powder was the same as one of the starting materials similarly to Example 12 and it was also confirmed that the oxidation during the preparation of the Cu—Ga alloy powder was prevented.

Also this Cu—Ga alloy powder was employed to produce a target body, similarly to Example 12. The density based on the size and the weight of the target body was 8.41 g/cm³. The SEM observation of the target body's section conducted similarly to Example 12 showed a dense material with no voids. The EPMA observation showed no segregation of the Ga concentration and the variation of the Ga concentration within ±5%. Accordingly the Cu—Ga alloy matrix is considered to be uniform.

Also a Cu—Ga alloy target was produced similarly to Example 12 and it was proven that a satisfactory sputtering could be accomplished without any abnormal electrical discharge or splash.

Example 20

The same processing as Example 12 was performed, except for using an atomized Cu powder (a mean particle size: 1 μm, oxygen: 0.18% by mass), and as a result, a grey powder was obtained. This powder was subjected to the heat treatment and subjected to the EPMA observation similarly to Example 12, which showed the Cu—Ga alloy powder similar to Example 12. The Ga concentration of the Cu—Ga alloy powder analyzed was 32.2% by mass and the oxygen content of that was 0.19% by mass or less.

Also this Cu—Ga alloy powder was employed to produce a target body similarly to Example 12, whose density based on the size and the weight was 8.34 g/cm³. The SEM observation of the target body's section conducted similarly to Example 12 showed a dense material with no voids. The EPMA observation showed no segregation of the Ga concentration and the variation of the Ga concentration within ±5%. Accordingly the Cu—Ga alloy matrix is considered to be uniform.

Also a Cu—Ga alloy target was produced similarly to Example 12 and it was proven that a satisfactory sputtering could be accomplished without any abnormal electrical discharge or splash.

The evaluation results of Examples 12 to 20 are shown in Tables 2 and 3.

TABLE 2

| | Starting Cu powder | | | Mean particle size | Alloying temperature | Heating time | Heat treatment temperature | Heat treatment time | Ga concentration | Oxygen content |
|---|---|---|---|---|---|---|---|---|---|---|
| | Composition (% by mass) | | | | | | | | | |
| | Cu | Ga | Type | (μm) | (° C.) | time | (° C.) | time | (wt %) | (wt %) |
| Example 12 | 68 | 32 | Atomized powder | 5 | 70 | 1 Hours | 480 | 1 Hours | 32.1 | 0.10 |
| Example 13 | 68 | 32 | Electrolytic powder | 97 | 250 | 1 Hours | 480 | 1 Hours | 31.9 | 0.04 |
| Example 14 | 68 | 32 | Atomized powder | 38 | 550 | 1 Hours | — | — | 32.1 | 0.03 |

TABLE 2-continued

| | Starting Cu powder | | | Mean particle size (μm) | Alloying temperature (° C.) | Heating time | Heat treatment temperature (° C.) | Heat treatment time | Ga concentration (wt %) | Oxygen content (wt %) |
|---|---|---|---|---|---|---|---|---|---|---|
| | Composition (% by mass) | | | | | | | | | |
| | Cu | Ga | Type | | | | | | | |
| Example 15 | 80 | 20 | Atomized powder | 38 | 550 | 1 Hours | — | — | 19.9 | 0.03 |
| Example 16 | 60 | 40 | Atomized powder | 38 | 550 | 1 Hours | — | — | 40.0 | 0.03 |
| Example 17 | 68 | 32 | Atomized powder | 178 | 550 | 1 Hours | — | — | 32.0 | 0.01 or less |
| Example 18 | 68 | 32 | Electrolytic powder | 300 | 700 | 2 Hours | — | — | 32.0 | 0.05 |
| Example 19 | 68 | 32 | Electrolytic powder | 97 | 30 | 1 Hours | 480 | 1 Hours | 32.1 | 0.02 |
| Example 20 | 68 | 32 | Atomized powder | 1 | 30 | 1 Hours | 480 | 1 Hours | 32.2 | 0.19 |

TABLE 3

| | Sintering method | Hot press temperature (° C.) | Sintered body density (g/cm$^3$) |
|---|---|---|---|
| Example 12 | Hot press | 700 | 8.32 |
| Example 13 | Hot press | 700 | 8.41 |
| Example 14 | Hot press | 700 | 8.36 |
| Example 15 | Hot press | 700 | 8.31 |
| Example 16 | Hot press | 400 | 8.43 |
| Example 17 | Hot press | 700 | 8.29 |
| Example 18 | Hot press | 700 | 8.30 |
| Example 19 | Hot press | 700 | 8.41 |
| Example 20 | Hot press | 700 | 8.34 |

Based on the results shown above, it was found that, the Cu—Ga alloy powder can be obtained by stirring the Cu powder and the Ga with heating, and the Cu—Ga alloy sputtering target having a uniform composition can readily be obtained by sintering the Cu—Ga alloy powder. Accordingly, the present invention can produce the Cu—Ga alloy powder at low cost because the present invention can be substituted for a prior art that a Cu—Ga alloy ingot is obtained by melting/casting method at a high temperature followed by pulverization.

The invention claimed is:

1. A method for producing a Cu—Ga alloy powder comprising stirring a mixed powder containing a Cu powder and a Ga in a mass ratio of 85:15 to 55:45 at a temperature of 30 to 700° C. in an inert atmosphere thereby accomplishing alloying, wherein a mean particle size of the Cu powder is 1 to 300 μm.

2. The method for producing a Cu—Ga alloy powder according to claim 1, wherein the mixed powder is stirred at a temperature of 30° C. or higher and below 400° C. in an inert atmosphere and a Cu—Ga binary alloy layer is formed on the surface of the Cu powder.

3. The method for producing a Cu—Ga alloy powder according to claim 1, wherein the mixed powder is stirred at a temperature of 400° C. or higher and 700° C. or lower in an inert atmosphere and a Cu—Ga binary alloy is formed inside of the Cu powder.

4. The method for producing a Cu—Ga alloy powder according to claim 1, wherein the mixed powder is stirred at a temperature of 30° C. or higher and below 400° C. in an inert atmosphere thereby accomplishing alloying and the resultant alloyed powder is subjected to a heat treatment at a temperature of 400° C. or higher and 700° C. or lower in an inert atmosphere.

5. A method for producing a Cu—Ga alloy sputtering target, the method comprising:
a preparation step for preparing a Cu—Ga alloy powder by stirring a mixed powder containing a Cu powder and a Ga in a mass ratio of 85:15 to 55:45 at a temperature of 30 to 700° C. in an inert atmosphere thereby accomplishing alloying; and
a sintering step for molding the Cu—Ga alloy powder followed by sintering, wherein a mean particle size of the Cu powder is 1 to 300 μm.

6. The method for producing a Cu—Ga alloy sputtering target according to claim 5, wherein the sintering step employs a hot press method.

* * * * *